US008392634B2

(12) United States Patent
Ishino et al.

(10) Patent No.: US 8,392,634 B2
(45) Date of Patent: Mar. 5, 2013

(54) PROGRAMMABLE CONTROLLER WITH BUILDING BLOCKS HAVING MODULES THAT CAN BE COMBINED INTO A SINGLE UNIT

(75) Inventors: Tomohisa Ishino, Kusatsu (JP); Norio Furuishi, Kusatsu (JP)

(73) Assignee: OMRON Corporation, Kyoto (JP)

( * ) Notice: Subject to any disclaimer, the term of this patent is extended or adjusted under 35 U.S.C. 154(b) by 1410 days.

(21) Appl. No.: 12/036,934

(22) Filed: Feb. 25, 2008

(65) Prior Publication Data
US 2008/0222325 A1 Sep. 11, 2008

(30) Foreign Application Priority Data

Mar. 9, 2007 (JP) ................................. 2007-059763
Mar. 9, 2007 (JP) ................................. 2007-059770

(51) Int. Cl.
*G06F 3/00* (2006.01)
*G06F 5/00* (2006.01)
(52) U.S. Cl. ............................................. 710/38; 710/2
(58) Field of Classification Search .................. None
See application file for complete search history.

(56) References Cited

U.S. PATENT DOCUMENTS

| 6,914,914 | B1 * | 7/2005 | Flood et al. ............ 370/503 |
| 7,213,097 | B2 * | 5/2007 | Kasame et al. ......... 710/317 |
| 2003/0005196 | A1 | 1/2003 | Reed |
| 2008/0244150 | A1 * | 10/2008 | Sharma .................. 710/316 |

FOREIGN PATENT DOCUMENTS

| DE | 4121152 | 1/1993 |
| EP | 1398677 | 3/2004 |
| JP | 2001-100809 | 4/2001 |
| JP | 2003-18215 | 1/2003 |
| JP | 2003-504758 | 4/2003 |
| JP | 2003-131815 | 5/2003 |
| JP | 2005-4556 | 1/2005 |
| JP | 2006-39831 | 2/2006 |
| WO | 01/04764 | 1/2001 |

OTHER PUBLICATIONS

EP patent application No. 08152021.5, Search Report mailed Oct. 9, 2008.
JP patent application No. 2008-058748, Office Action mailed Dec. 16, 2011.
JP patent application No. 2008-058766, Office Action mailed May 10, 2012.

* cited by examiner

*Primary Examiner* — Idriss N Alrobaye
*Assistant Examiner* — Richard B Franklin
(74) *Attorney, Agent, or Firm* — Weaver Austin Villeneuve & Sampson LLP

(57) ABSTRACT

A PLC of building block type includes a switch module incorporating a switch part having N-to-N switch function between serial communication lines with a plurality of lines and a plurality of device modules individually incorporating device systems with various advanced-function device module characteristics. A CPU system having CPU functions of the PLC may be incorporated in the switch module, the switch module incorporating the CPU system and the plurality of device modules being connected together into a single body in a building block structure through module-connecting mechanisms. Dedicated serial communication lines each with a single line or a plurality of lines connect between the switch module incorporating the CPU system and each of the plurality of device modules such that a star-shaped serial communication network is formed with the switch module incorporating the CPU system as a central node and each of the plurality of device modules as a peripheral node.

13 Claims, 14 Drawing Sheets

PROGRAMMABLE CONTROLLER WITH BUILDING BLOCKS HAVING MODULES THAT CAN BE COMBINED INTO A SINGLE UNIT

This application claims priority on Japanese Patent Applications 2007-059763 and 2007-059770 both filed Mar. 9, 2007.

BACKGROUND OF THE INVENTION

This invention relates to a programmable controller with building blocks (hereinafter referred to as PLC of the building block type), provided with device modules with various functions (such as IO module, analog IO module, process IO module, motion control module, process CPU module and communication modules of various kinds supporting communication protocols) such that these device modules can be appropriately selected and combined into a single unit through specified inter-module connection mechanisms in order to flexibly respond to a wide variety of control specifications on the side of the users.

As disclosed in Japanese Patent Publications Tokkai 2007-18503 and 09-181750, for example, there have been known various kinds of PLCs of the building block type provided with device modules with various functions, making it possible to flexibly respond to a wide variety of users' control specifications by combining them into a single unit through specified inter-module connecting mechanisms. Parallel bus, serial bus and bucket relay systems are known examples of method for carrying out inter-module communications in such a PLC of the building block type.

FIG. 10 shows a PLC 2A of the building block type adapted to carry out inter-module communications by the parallel bus method, comprising one CPU module 20 and four device modules 21. The CPU module 20 has incorporated therein a CPU system 201 for carrying out its functions as the central processing unit (CPU) of the PLC, and each of the device modules 21 has incorporated therein a device system 211 which is necessary for carrying out the device functions required of that module.

According to the illustrated example, these modules 20 and 21 are connected together into a single unit through inter-module connection mechanisms of the stacking type. Explained more in detail, these modules 20 and 21 are arranged sequentially in a single line in the right-left direction, with the side surfaces of the mutually adjacent pairs thereof in contact with or near each other and having connectors CN in between. Each connector CN has a left-hand connector half CN(L) and a right-hand connector half CN(R) that together form a pair. The left-hand connector half CN(L) of one of the connectors CN is affixed to the right-hand side surface of the housing of the CPU module 20. The left-hand side surface of the housing of each device module 21 has the right-hand connector half CN(R) of a corresponding one of the connectors CN affixed thereto, and the right-hand side surface of the same housing has the left-hand connector half CN(L) of another connector CN affixed thereto. Each connector CN includes a group of terminals corresponding to signal lines that form a parallel bus PB.

The parallel bus PB, which has its base terminals inside the CPU module 20, is connected to a communication terminal group in the left-hand connector half CN(L) on the right-hand side surface of the housing of the CPU module 20. A communication interface (I/F) 202A is inserted between the parallel bus PB and the CPU system 201.

Inside each of the device modules 21, the communication terminal group inside the right-hand connector half CN(R) on the left-hand side surface of the housing and that inside the left-hand connector half CN(L) on the right-hand side surface of the housing are connected by an internal connector line PCL, and there is a communication interface (I/F) 212A inserted between this internal connector line PCL and the device system 211.

With the modules thus structured, if the housing of each device module 21 is connected to the housing of the CPU module 20 through the connectors CN, the parallel bus PB penetrates through the series of modules 20 and 21, and data of various kinds necessary for the operation of the PLC can be exchanged among the CPU system 201 inside the CPU module 20 and the device systems 211 inside the individual device modules 21.

FIG. 11 shows a PLC 2B adapted to carry out inter-module communications by the serial bus method by using the same symbols to indicate components similar to those described above in FIG. 10. In this example, a bidirectional serial bus SB (including two buses with different directions of data transmission) is connected inside the CPU module 20 to a communication terminal group inside the left-hand connector half CN(L) on the right-hand side surface of the housing, and a communication interface (I/F) 202B with the serial-parallel conversion function is inserted between this bidirectional serial bus SB and the CPU system 201.

Inside each of the device modules 21, the communication terminal group inside the right-hand connector half CN(R) on the left-hand side surface of the housing and that inside the left-hand connector half CN(L) on the right-hand side surface of the housing are connected by an internal connector line SCL, and there is a communication interface (I/F) 212B with the serial-parallel conversion function inserted between this internal connector line SCL and the device system 211.

With the modules thus structured, if the housing of each device module 21 is connected to the housing of the CPU module 20 through the connectors CN, the serial bus SB penetrates through the series of modules 20 and 21, and data of various kinds necessary for the operation of the PLC can be exchanged among the CPU system 201 inside the CPU module 20 and the device systems 211 inside the individual device modules 21 through the serial bus SB.

FIG. 12 shows a PLC 2C adapted to carry out inter-module communications by the bucket relay method by using the same symbols to indicate components similar to those described above in FIG. 10. In this example, a serial bus SB is provided inside the CPU module 20, having its base terminals therein and being connected to a communication terminal group inside the left-hand connector half CN(L) on the right-hand side surface of the housing. Inside the CPU module 20, a communication interface (I/F) 202C with the serial-parallel conversion function is inserted between the serial bus SB and the CPU system 201.

Inside each of the device modules 21, the communication terminal group inside the right-hand connector half CN(R) on the left-hand side surface of the housing is connected to a communication interface (I/F) 212C through a first connection line SCL1, and the communication terminal group inside the left-hand connector half CN(L) on the right-hand side surface of the housing is connected to the communication interface (I/F) 212C through a second connection line SCL2.

With the modules thus structured, if the housing of each device module 21 is connected to the housing of the CPU module 20 through the connectors CN, the serial bus SB penetrates sequentially through the communication interfaces (I/F) 212C of each of the device modules 21. The device system 211 inside each of the device modules 21 will transmit each of the data received from an adjacent module to the other adjacent module in the manner of a bucket relay such that data of various kinds necessary for the operation of the PLC can be exchanged among the CPU system 201 inside the CPU module 20 and the device systems 211 inside the individual device modules 21.

Thus, with a prior art PLC of the building block type, it was a common practice to carry out communications among the modules either through a bus (PB or SB) in multidrop connection by the parallel bus method shown in FIG. 10 or by the serial bus method shown in FIG. 11 or through connection lines (SCL and SCL2) between adjacent pairs of modules by the bucket relay method shown in FIG. 12.

If communications between the modules are by the parallel bus method shown by FIG. 10, the communication speed cannot be improved due to skews among the bits, cross talks and ground bounce. If the communications are by the serial bus method shown by FIG. 11, there is also a limit to the improvement in the communication speed because the effects of signal degradation due to 1-to-N connections and ground bounce are not negligible. As for the communications among the modules by the bucket relay method, there is the problem of all modules becoming incapable of carrying out communications because of a trouble in one of the intermediate modules. By any of these methods using a bus or connection lines among the modules, there is the problem of the transmission capability being significantly affected as the number of the connected modules is increased because of the limitations arising from the basic structure of the method using a bus.

SUMMARY OF THE INVENTION

It is therefore an object of this invention in view of these problems to provide a PLC of the building block type, which is not adversely affected by skews among bits, cross talks or ground bounce and uses a communication method not affected by the increase of the number of connected modules.

Other objects and effects of this invention will become clearly understandable by referencing the disclosure that follows.

A PLC of building block type according to this invention may be characterized as comprising a switch module incorporating a switch part having N-to-N switch function between serial communication lines with a plurality of lines and a plurality of device modules individually incorporating device systems with various advanced-function device module characteristics wherein a CPU system having CPU functions of the PLC is incorporated either in the switch module or in a CPU module that is provided independently of this switch module. The switch module incorporating the CPU system and the plurality of device modules, or the switch module not incorporating the CPU system, the CPU module and the plurality of device modules, are connected together into a single body in a building block structure through module-connecting mechanisms of a specified kind. Dedicated serial communication lines each with a single line or a plurality of lines connect between the switch module incorporating the CPU system and each of the plurality of device modules such that a star-shaped serial communication network is formed with the switch module incorporating the CPU system as a central node and each of the plurality of device modules as a peripheral node, or between the switch module not incorporating the CPU system and the CPU system and each of the plurality of device modules such that a star-shaped serial communication network is formed with the switch module not incorporating the CPU system as a central node and the CPU system and each of the plurality of device modules as a peripheral node.

Since a PLC thus structured is basically for serial communication, there is no need to consider the effects of skews between bits, cross talks or ground bounce, unlike the situation using a parallel bus with multidrop connection. Since dedicated serial communication lines are used instead of bus lines, furthermore, the transmission capability is not adversely affected by an increase in the number of connected modules as long the switching operations by the switch part are appropriately designed. In particular, if a plurality of lines connected in parallel are used for the serial communication lines between each device module or the CPU module and the switch module, an optimal data communication capability can be maintained according to the transmission capacity of each module.

As the module-connecting mechanisms in the above, both the so-called back plane type and the stacking type can be utilized. As is well known by persons skilled in the art, a module-connecting mechanism of the back plane type has a conductor pattern corresponding to communication signal lines provided on a mother board referred to as the back plane and a plurality of modules connected to these signal lines through connectors such that these modules are mechanically and electrically connected. By the stacking method, connector halves are affixed to both side surfaces of each module housing and an inner connection line is provided inside each module to connect these connector halves. These similarly formed modules are connected through the connector halves such that a plurality of modules come to be mechanically and electrically connected into a single unit.

Explained more in detail, a module-connecting mechanism by the stacking method according to this invention may be characterized as including a connecting mechanism (also referred to as the first connecting mechanism for convenience) on the side of the switch module and another connecting mechanism (also referred to as the second connecting mechanism for convenience) on the side of each of the CPU module or one of the plurality of device modules.

In the above, the first connecting mechanism comprises a connector half on the side of the switch module that is provided on one of side surfaces of the module housing of the switch module and has communication terminal groups for a plurality of lines and switch connection lines that connect each of the communication terminal groups of the connector half on the side of the switch module and a corresponding one of communication ports of the switch part inside the switch module, and the second connecting mechanism comprises a near connector half on the CPU module or one of the plurality of device modules that is provided on a side surface of the module housing of the corresponding module on the side nearer the switch module when the modules are connected together and has one or more communication terminal groups corresponding to the number of lines of serial communication lines introduced from another module adjacent on the nearer side, a far connector half on the CPU module or one of the plurality of device modules that is provided on another side surface of the module housing of the corresponding module on the side farther from the switch module when the modules are connected together and has one or more communication terminal groups corresponding to the number of lines of serial communication lines introduced from another module adjacent on the farther side, inner system connection lines connecting one or more of the communication terminal groups of the near connector half that are assigned to the corresponding module and a communication interface incorporated in the corresponding module, and inner connector connection lines connecting remaining ones of the communication terminal groups of the near connector half excluding the one or more assigned communication terminal groups and the communication terminal groups of the far connector half.

In this manner, a CPU module and any plural number of device modules can be connected to a single switch module and a PLC of the building block type having a serial communication network of the so-called star-type can be formed.

According to one aspect of the invention, free location is made possible for each of the modules of the PLC by adopting module-connecting mechanisms of a special type. For this purpose, the arrangement pattern of the plurality of communication terminal groups of the near connector half and that of the plurality of communication terminal groups of the far connector half are arranged to be the same in the second connecting mechanism such that any mutually adjacent modules can be freely connected, and the inner connector connection lines are arranged to connect the near connector half and the far connector half such that aforementioned remaining ones of the communication terminal groups will be shifted as a whole by the number of communication lines assigned to the corresponding device module to the uppermost or lowermost position in the arrangement of communication terminal groups in the far connector half while maintaining the arrangement sequence of the terminal groups.

With such a structure, it is always a serial communication line corresponding to a currently open line that appears in the communication terminal group at the uppermost or lowermost position. In the near connector half of any module, individual modules can be attached to any desired position within a series of modules by structuring the inner circuit board such that the serial communication lines assigned to itself will be introduced from the communication terminal group at the uppermost or lowermost position, or that the so-called free location becomes possible.

As for the switch part incorporated in the switch module, its role may be said to be somewhat like that of a telephone exchange. It comprises a memory that stores setting data for defining an operation form for carrying out the N-to-N switch function and carries out switching operations according to the operation form defined by the setting data stored by the memory. The operation form may be defined in various different ways. As one example, the operation form defined by the setting data is such that any communication frame inputted to one of communication ports of the switch part is unconditionally caused to be outputted from preliminarily determined one or more of the communication ports. This corresponds, for example, to providing a telephone exchange machine with a dedicated line service. By this example, specified ones of the communication ports are always maintained in the connected condition and hence a series of frames can be quickly exchanged among these communication ports without providing any switching command or the like.

As another example, the operation form may be defined such that a communication frame inputted to one of communication ports of the switch part is caused to be outputted from one or more of the communication ports that are determined by addressee data contained in the inputted frame. By this example, switching can be controlled on the side of each module. Thus, the addressee data may be appropriately changed such that data communications become possible with the optimum addressee according to the current control conditions among the modules. In the case of a module connected to the switch module through two or more lines, the same or different addressee data may be attached to the frames through the different lines such that multiple or distributed communications can be carried out depending on the current control conditions.

As a third example, the operation form may be defined such that if serial data with a plurality of frames in series are inputted to one of communication ports of the switch part and the first frame contains addressee data and a switch hold command, the switch condition is maintained in a hold condition until the series of frames is completely outputted from one or more of the communication ports that are determined by the addressee data. By this example, although relatively short data of one frame or a small number of frames may usually be transmitted, such a switch hold command can be included in the first frame when a large amount of data formed with a large number of frames are being transmitted such that such a large amount of data can be transmitted summarily to a specified addressee without carrying out the switching operations in units of frames.

According to this invention, furthermore, the aforementioned plurality of device modules include a multi-line supporting device module that has a plurality of communication ports each for connecting to different one of dedicated serial communication lines and a communication interface between the plurality of communication ports and the device system inside. In the above, the communication interface includes a transmission processing part that generates multi-system transmission frames to be transmitted from individual ones of the plurality of communication ports based on single-system original transmission data, and a reception processing part that generates single-system reception frames based on multi-system reception frames obtained from individual ones of the plurality of communication ports.

Since a PLC thus structured is basically for serial communication, there is no need to consider the effects of skews between bits, cross talks or ground bounce, unlike the situation using a parallel bus with multidrop connection. Since dedicated serial communication lines are used instead of bus lines, furthermore, the transmission capability is not adversely affected by an increase in the number of connected modules as long the switching operations by the switch part are appropriately designed. In particular, if a plurality of lines connected in parallel are used for the serial communication lines between each device module or the CPU module and the switch module, an optimal data communication capability can be maintained according to the transmission capacity of each module.

Moreover, according to this invention, an optimum transmission mode can be selected according to the current condition during the operation of the PLC because it is possible to appropriately correlate single-system original communication data and multi-line serial communication lines, instead of transmitting single-system original transmission data directly to a single-system serial communication line. At the time of reception, too, an optimum reception mode can be selected according to the current condition since multi-system reception frames can be received in correlation with single-system reception data, instead of receiving them by individually switching them.

As one example of such transmission modes, each of the multi-system transmission frames may contain data identical to the original transmission data as real transmission data and data identical to the original transmission data may be repeatedly (duplicatingly) transmitted to individual ones of the serial communication lines connected between that device module and the switch module. With such a choice, data requiring a high level of reliability may be transmitted repeatedly to each of multi-line serial communication lines.

As another example of transmission modes, each of the multi-system transmission frames may contain, as real transmission data, individual divided data obtained by dividing the original transmission data and the individual divided data may be transmitted separately to individual ones of the serial communication lines connected between that device module and the switch module. By this mode, the speed of data communication can be increased.

As one example of reception modes, the single-system reception frames may be formed as a single data item selected according to a specified rule from reception data contained in the multiple-system reception frames. By such a mode, a reliable reception operation becomes possible because even if one of the serial communication lines may fail, it is possible to switch to another communication line.

As another example of reception modes, the single-system reception frames may be formed as combined data obtained by combining reception data contained in the multiple-system reception frames. In this manner, since data received in parallel through multi-line serial communication lines are combined together to form combined data, it is possible to reproduce the original data from divided data.

PLCs of the building block type described above may be said to be more advantageous than PLCs of the building block type using the conventional parallel bus, serial bus or link method when the transmission speed of each of the serial communication lines is 2 Gbps or faster.

Since it is basically a serial communication according to this invention, there is no need to consider the effects of skews between bits, cross talks or ground bounce, unlike the situation using a parallel bus with multidrop connection. Since dedicated serial communication lines are used instead of bus lines, furthermore, the transmission capability is not adversely affected by an increase in the number of connected modules as long the switching operations by the switch part are appropriately designed. In particular, if a plurality of lines connected in parallel are used for the serial communication lines between each device module or the CPU module and the switch module, an optimal data communication capability can be maintained according to the transmission capacity of each module.

In summary, it is not that original transmission data are directly transmitted to single-system serial communication lines but that they are appropriately correlated to the multi-line serial communication lines. Thus, optimum transmission and reception modes can be selected as explained above. This is made possible, according to this invention, by providing a multi-line supporting device module provided with a plurality of communication ports each for connecting to different one of dedicated serial communication lines and a communication interface between the plurality of communication ports and the device system inside, the communication interface including a transmission processing part that generates multi-system transmission frames to be transmitted from individual ones of the plurality of communication ports based on single-system original transmission data and a reception processing part that generates single-system reception frames based on multi-system reception frames obtained from individual ones of the plurality of communication ports.

DETAILED DESCRIPTION OF THE INVENTION

The invention is described next by way of an embodiment with reference to the drawings.

Figure 1:
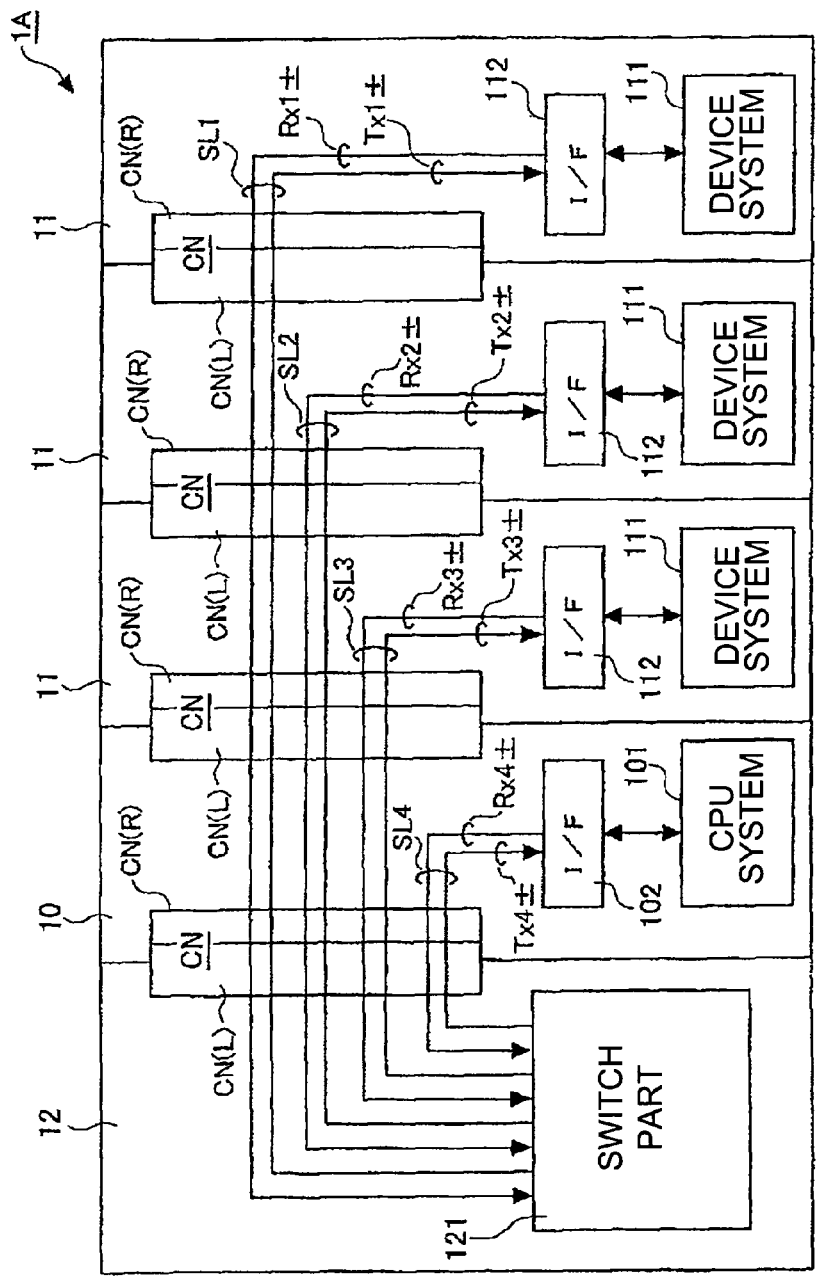
FIG. 1 is a structural diagram of a PLC embodying this invention.

FIG. 1 is a structural diagram of an example of PLC 1A embodying this invention. As shown, this PLC 1A comprises a CPU module 10 incorporating a CPU system 101 for carrying out the CPU functions of a PLC and a communication interface (I/F) 102, a plurality of (three according to the illustrated example) device modules 11 each incorporating a device system 111 for carrying out the functions of device modules such as an IO module or a variety of special high-level function modules and a communication interface (I/F) 112 and a switch module 12 incorporating a switch part 121 with an N-to-N switch function among a plurality of serial communication lines (four lines SL1-SL4 according to the illustrated example).

These modules 10, 11 and 12, as will be explained in detail below, are connected together to form a single unit through module-connecting mechanisms using the stacking method for building blocks. Under this connected condition through these module-connecting mechanisms, dedicated serial communication lines SL1-SL4 each with a single line or a plurality of lines (single lines in the illustrated example) are connecting between the switch module 13, the three device modules 11 and the single CPU module 10. In this manner, a star-shaped serial communication network is constructed with the switch module 12 serving as the central node and the CPU modules 10 and the three device modules 11 serving as peripheral nodes.

Next, the module-connecting mechanism is explained in detail. This mechanism comprises mechanisms on the individual sides, that is, a connection mechanism on the side of the switch module 12 and connection mechanisms on the sides of the CPU module 10 and the three device modules 11.

Figure 3:
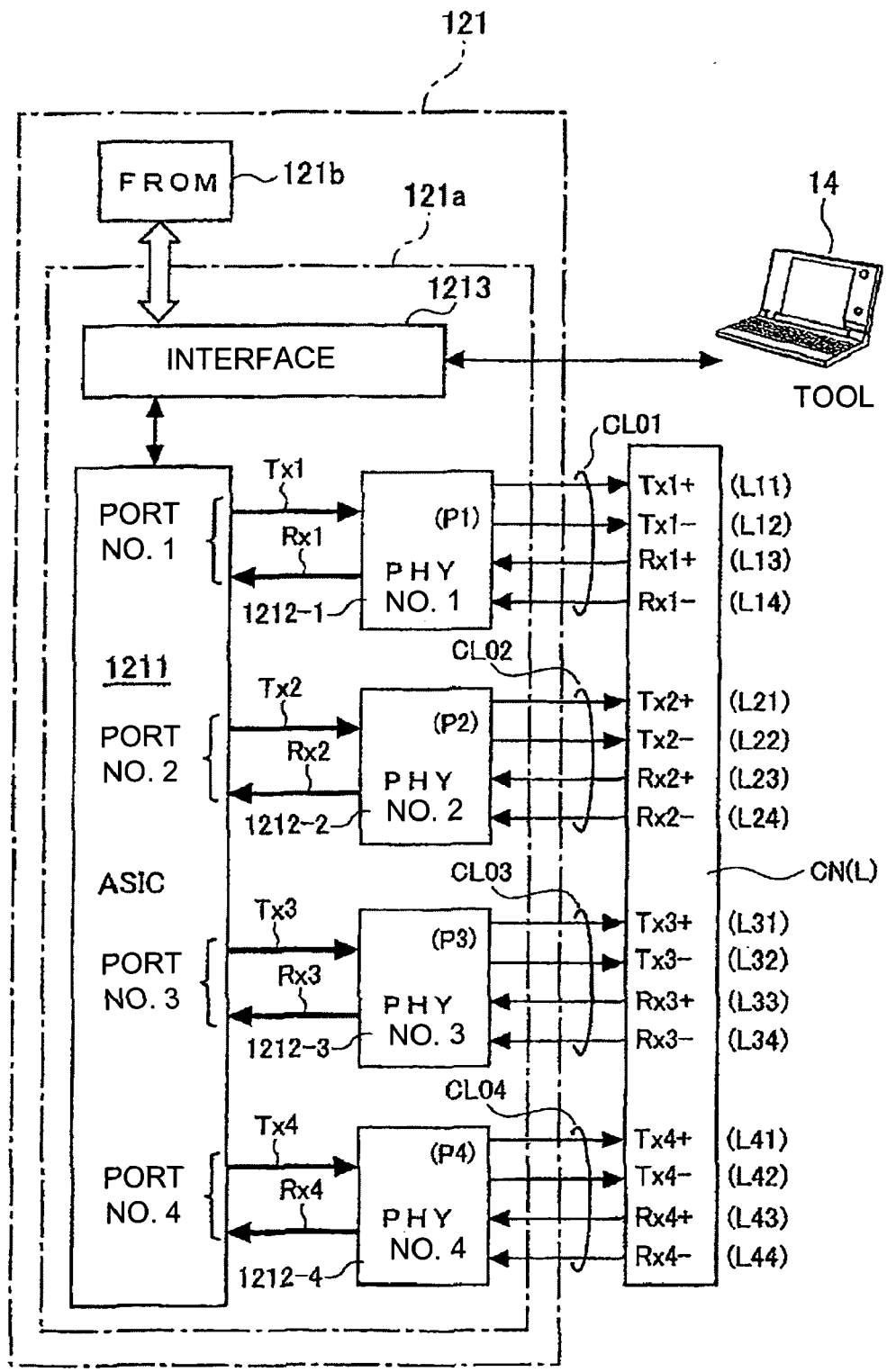
FIG. 3 is a structural diagram of the switch module of FIG. 1.

FIG. 3 is a structural diagram that shows the internal details of the switch module 12. As shown, the connection mechanism on the side of the switch module 12 includes a connector half CN(L) on the side of the switch module which is provided on either of the side surfaces (on the right-hand side in the illustrated example) of the module housing and has communication terminal groups (L11-L14, L21-L24, L31-L34 and L41-L44) for a plurality of lines (four lines according to the illustrated example) and switch-connecting lines CL01-CL04 for connecting these communication terminal groups (L11-L14, L21-L24, L31-L34 and L41-L44) of this connector half CN(L) on the side of the switch module 12 with corresponding communication ports P1-P4 of the switch part 121 inside the switch module 12.

Figure 4:
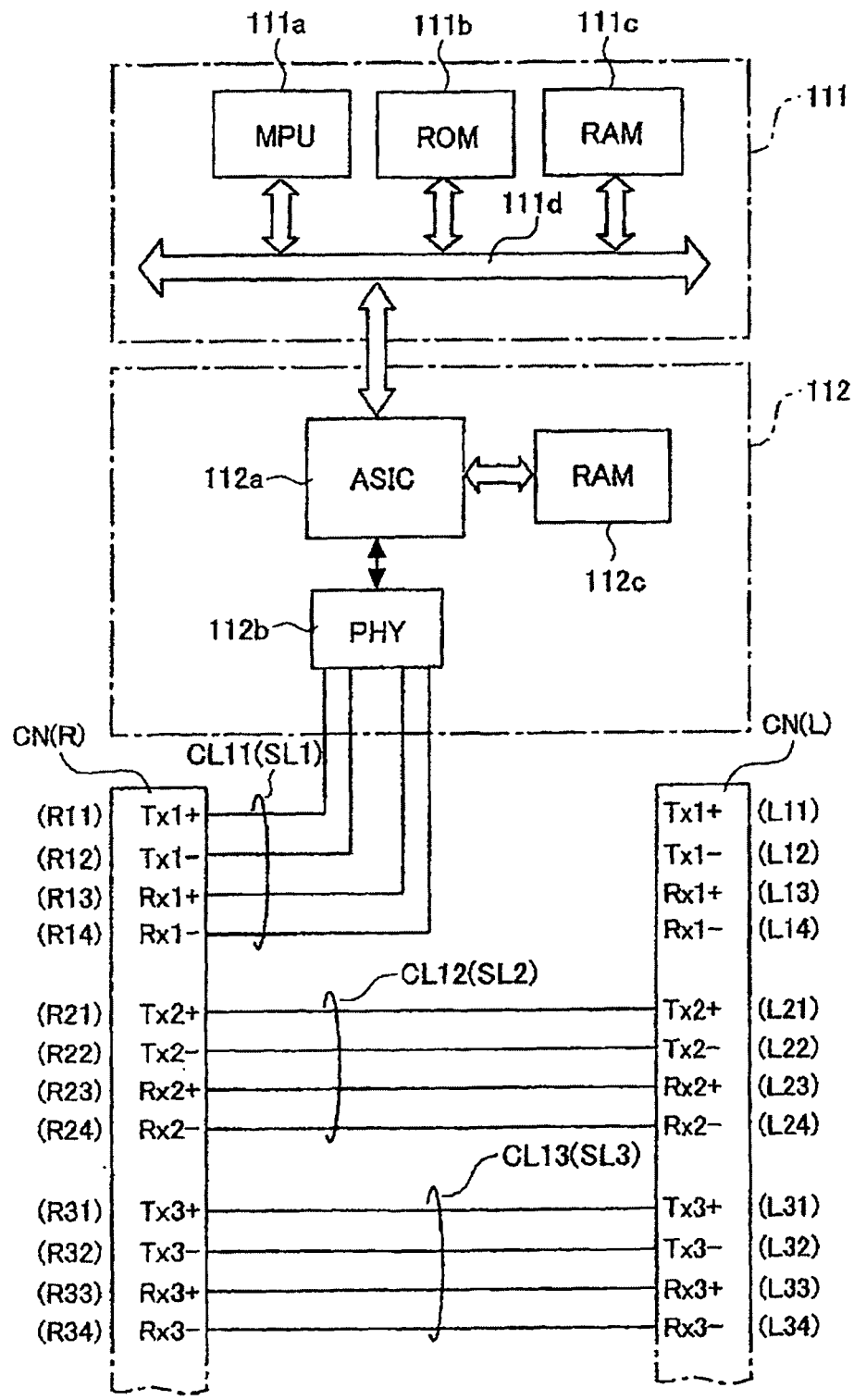
FIG. 4 is a structural diagram of a device module of FIG. 1.

FIG. 4 is a structural diagram that shows the internal details of a device module 11. As shown, the connection mechanism on the side of the device module 11 (and similarly on the side of the CPU module 10) includes a near-side connector half CN(R) which is provided on the closer side surface of its module housing to the switch module 12 in the case of the assumed module connection (as shown in FIG. 1) and has one or more (three according to the illustrated example) communication terminal groups (R11-R14, R21-R24, R31-R34 and R41-R44) corresponding to the number of serial communication lines (SL1-SL3) introduced from another module adjacent on the near side, a far-side connector half CN(L) which is provided on the surface of its module housing on the farther side surface of its module housing from the switch module 12 again in the case of the assumed module connection (as shown in FIG. 1) and has one or more communication terminal groups (L11-L14, L21-L24 and L31-L34) corresponding to the number of serial communication lines (L21-L24 and L31-L34) led out to another module adjacent on the farther side, internal system connection line CL11 for connecting the communication terminal group (R11-R14) of one or more (one according to the illustrated example) of the lines of the near-side connector half CN(R) and the communication interface 112 of the internal system 111 incorporated in that module, and inter-connector internal connection lines (CL12 and CL13) for connecting the remaining communication terminal groups (R21-R24 and R31-R34) of the aforementioned near-side connector half CN(R) other than those of the one or more lines assigned to this module and the communication terminal groups (L21-L24 and L31-L34) of the far-side connector half CN(L).

The communication interface (I/F) 112 is provided, according to this example, with an ASIC 112a for carrying out frame generation and parallel-serial conversions at the time of transmission and parallel-serial conversions and data reproduction function at the time of reception, an conversion element (PHY) 112b for carrying out conversion function between a transmission-reception single system signal and a transmission-reception differential pair signal and a RAM 112c which serves as a transmission buffer and a reception buffer.

The device system 111 serves to represent the circuit elements for carrying out the functions required of that device, comprising in the case of this example, a microprocessor (MPU) 111a, a ROM 111b and a RAM 111c. If the device module is an IO module, an analog IO module or a process IO module having input and output functions to the exterior, an external 10 circuit is separately provided.

Figure 8:
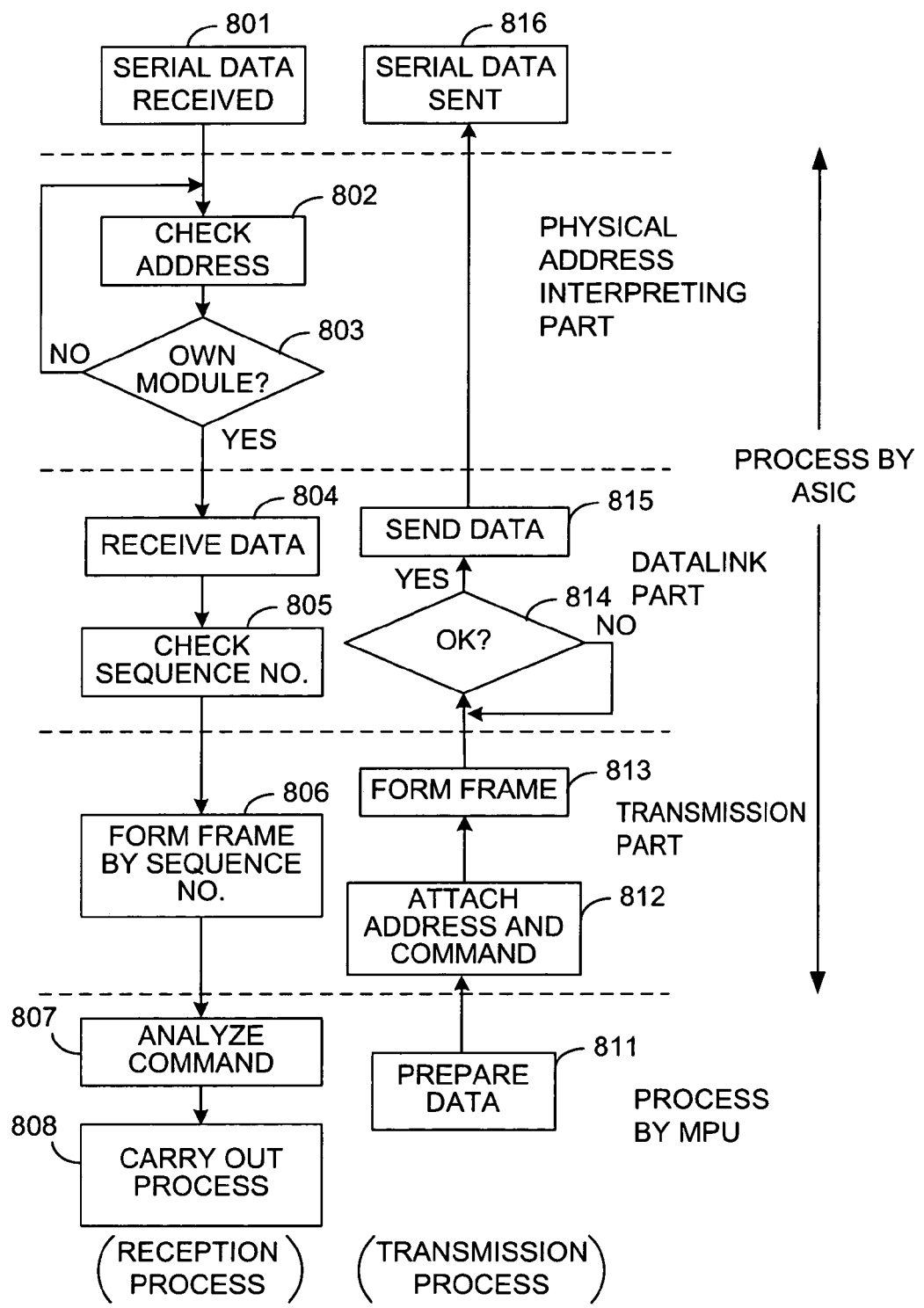
FIG. 8 is a flowchart for showing the operations of the ASIC incorporated in each module.
Figure 10:
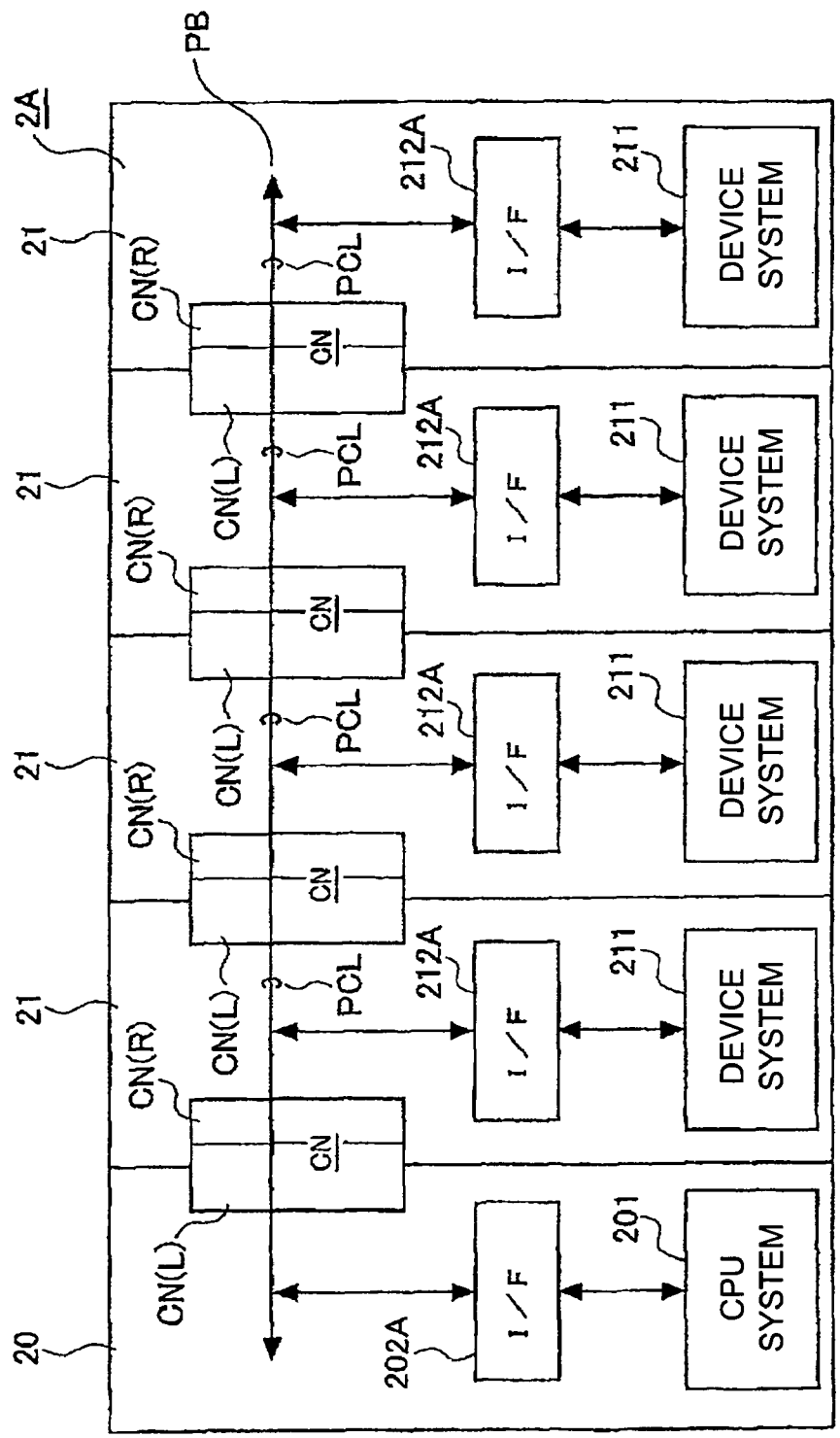
FIG. 10 is a diagram for explaining a PLC for carrying out communications among the modules by the parallel bus method.
Figure 11:
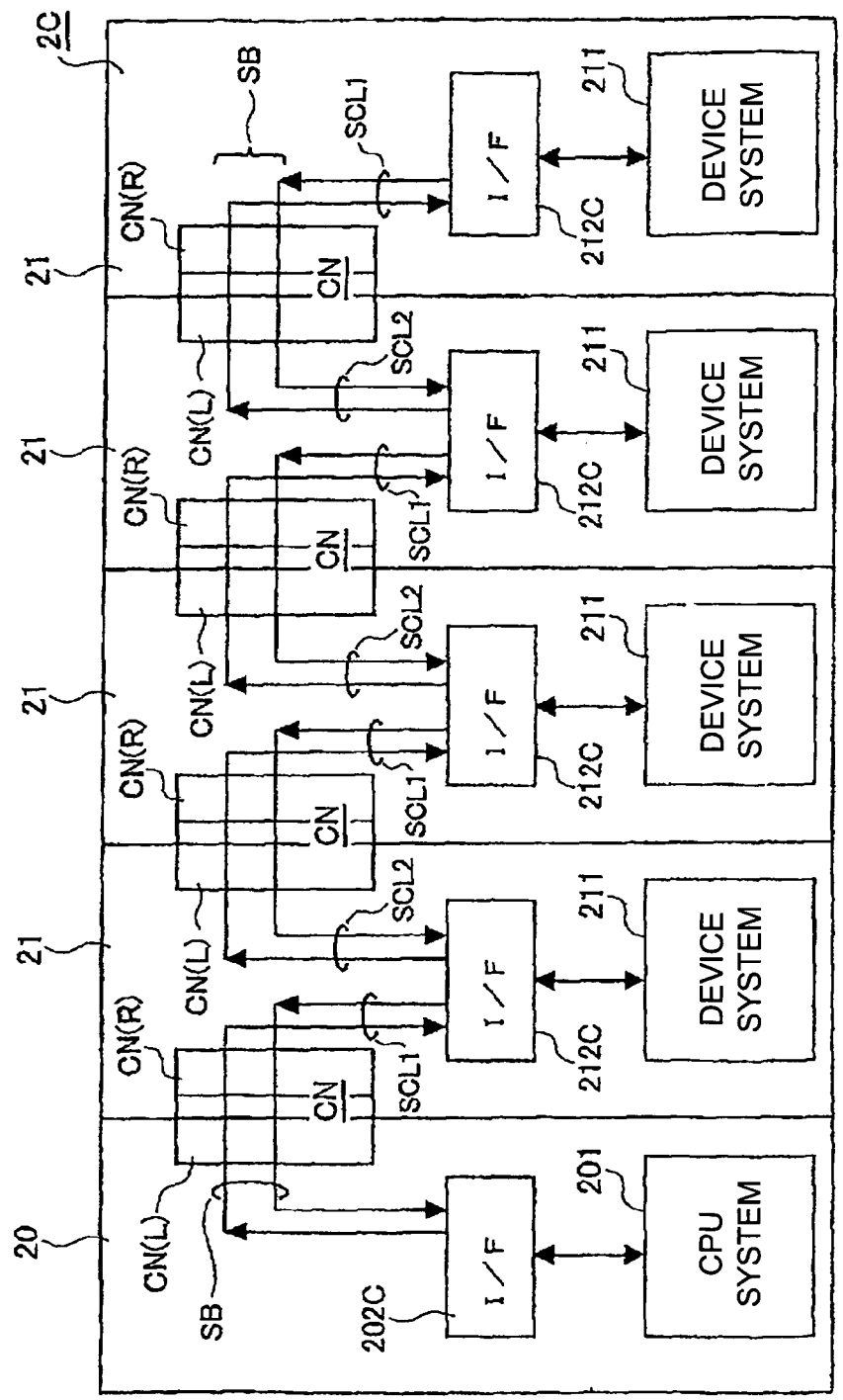
FIG. 11 is a diagram for explaining a PLC for carrying out communications among the modules by the serial bus method.
Figure 12:
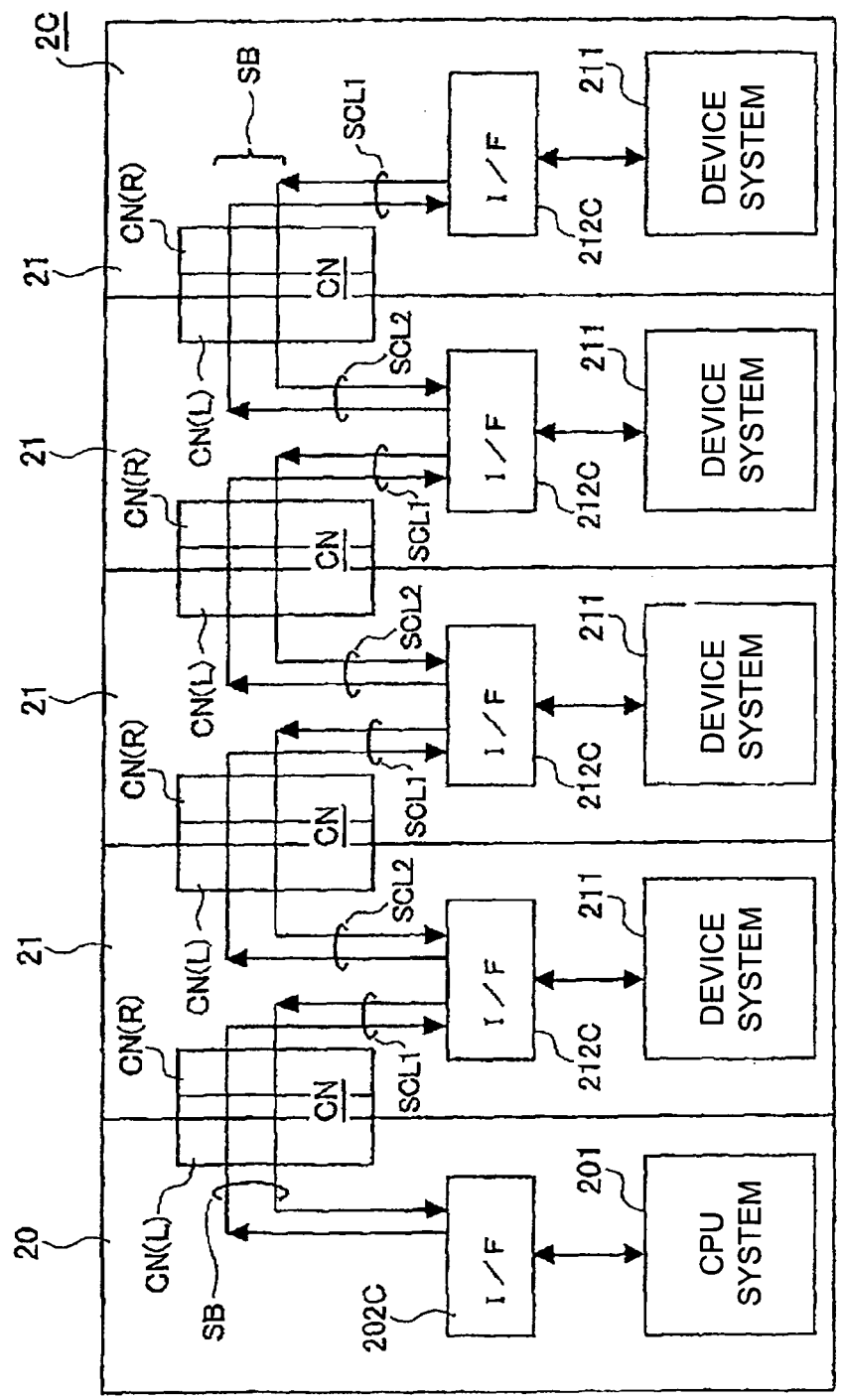
FIG. 12 is a diagram for explaining a PLC for carrying out communications among the modules by the bucket relay method.

A flowchart for showing the operations of the ASIC incorporated in each module is shown in FIG. 8. As shown, as serial data are received by a module (Step 801), they are delivered through PHY (conversion element) 112b to the ASIC 112a. The address of the arriving serial data is checked by the physical address interpreting part of the ASIC 112a (Step 802) and if this coincides with its own address (YES in Step 803), they are delivered to the datalink part. The datalink part not only receives the delivered data (Step 804) but also checks the attached sequence number (Step 805) and thereafter delivers the data to the transmission part. The transmission part forms a frame according to the attached sequence number (Step 806). On the side of the MPU 111a, a command analysis is carried out based on the reformed frame (Step 807) and the process which corresponds to this analyzed command is carried out (Step 808).

At the time of a transmission process, the MPU 111a prepares transmission data (Step 811) and transmits the prepared data for transmission to the transmission part of the ASIC 112a. The transmission part of the ASIC 112a serves to attach the addressee's address and commands to the received transmission data (Step 812) and also to reform them into a frame (Step 813) and deliver them to the datalink part. Under the condition that the data transmission be possible (YES in Step 814), these data are transmitted (Step 815) and the serial data are thus transmitted from the ASIC 112a (Step 816). If the response in Step 814 is NO, the program may be designed so as to wait until the data transmission becomes possible.

Figure 9:
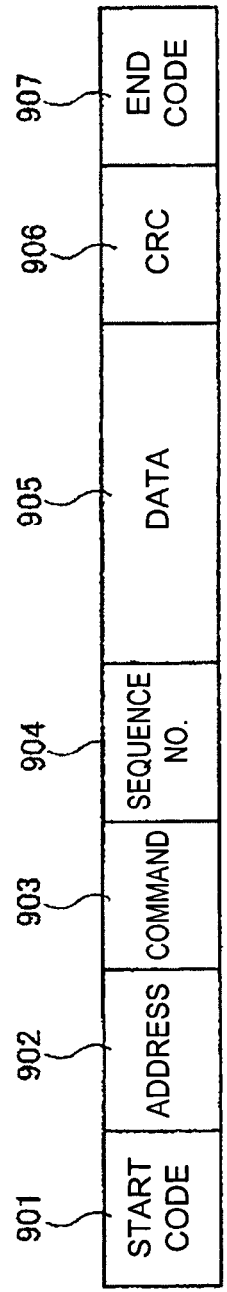
FIG. 9 is a diagram for the explanation of a frame.

FIG. 9 is an explanatory diagram of a frame. As shown, the frame handled by each module includes a start code 901 for indicating the start of a frame, an address 902 which indicates the addressee of the frame, a command 903 which indicate a read request, a write request, a read response, etc., a sequence number 904 which indicates an sequence if a data group is divided into a plurality of frames, data 905 to be transmitted, an error check code (CRC) 906 for guaranteeing the security of the data in the data section and an end code 907 for indicating the end of the frame. The portion consisting of the address 902, the command 903 and the sequence number 904 is referred to as the header.

With reference back to FIG. 3, the switch part 121 inside the switch module 12 includes an inner circuit part 121a and a FROM 121b. Explained more in detail, the inner circuit part 121a is structured with an ASIC 1211 incorporating a circuit which serves as the heart part for carrying out the N-to-N switch function among the four serial communication lines (SL1-SL4), first through fourth PHYs (conversion elements) for the single line-differential line pair conversion provided respectively for the first through fourth ports of the ASIC 1211 and an interface 1213 between the ASIC 1211 and the FROM 121b as well as a setting tool 14.

Signals on the transmission lines Tx1-Tx4 respectively from the first through fourth ports of the ASIC 1211 are converted through the first through fourth PHYs into signals on the transmission differential line pairs Tx1±-Tx4±, while signals on the four reception differential line pairs Rx1±-Rx4± arriving from the connector half CN(L) are converted through the first through fourth PHYs into signals on the four reception differential line pairs Rx1±-Rx4±. In this example, the ports of the first through fourth PHYs on the side of the differential line pairs are referred to as communication ports (P1-P4).

The FROM 121b is to function as a memory for storing setting data for defining the switching operations when N-to-N switching operations among the four serial communication lines SL1-SL4 are carried out. The ASIC 1211, which forms the switch part 121, carries out switching operations as defined by these set data stored by the FROM 121b. The data stored by the FROM 121b can be freely changed through the interface 1213 by the operation of the tool 14.

Various operation forms can be defined by the set data stored by the FROM 121b. According to one operation form, the communication frame inputted to one of the communication ports of the switch part 121 is caused to be outputted unconditionally from one or more preliminarily determined communication ports. This is like a situation of operating as dedicated lines of a telephone exchange where, for example, a communication frame arriving at communication port P1 is unconditionally outputted from communication ports P2 and P3.

In such a situation, connections are always maintained among the specified communication ports and hence a series of frames can be exchanged among these ports without providing any switching command for each frame.

According to another operation form, the communication frame inputted to one of the communication ports of the switch part 121 is caused to be outputted from one or more of the other communication ports of the switch part 121 determined by the addressee data contained in that communication frame. If communication ports P3 and P4 are contained as addressee data at the beginning of a communication frame inputted at communication port P2, for example, this communication frame is outputted from communication ports P3 and P4.

In this situation, switching operations can be controlled on the side of each module with addressee data included in each communication frame that is transmitted from each module. Thus, since the addressee data can be freely changed, data communications with the optimal addressee become possible, depending on the current control conditions among a plurality of modules. In the case of a module connected to the switch module through two or more lines, multiple communications or distributed communications can be carried out depending on the current control conditions by attaching the same or different addressee data to frames flowing through different communication lines According to a third operation form, when serial data having a plurality of communication frames in a series are inputted to one of the communication ports of the switch part 121 and addressee data and a switch hold command are contained in their first frame, the switch condition is maintained in the hold condition until the output of this series of frames from the one or more communication ports of the switch part 121 determined by the addressee data is completed. This is a situation, for example, when serial data having many communication frames are inputted to communication port P4 of the switch part 121 and the first frame contains communication ports P1 and P2 as is addressee data and a switch hold command. Then, the switch condition is maintained in the hold condition until this series of frames is completely outputted from communication ports P1 and P2.

With this construction, although relatively short data of one frame or a small number of frames may usually be transmitted, such a switch hold command can be included in the first frame when a large amount of data formed with a large of number of frames are being transmitted such that such a large amount of data can be transmitted summarily to a specified addressee without carrying out the switching operations in units of frames.

By such a module-connecting mechanism as described above, since a left-hand connector half CN(L) is affixed to the right-hand side surface of the housing of the switch module 12 and a right-hand connector half CN(R) and a left-hand half CN(L) are affixed to the left-hand and right-hand side surfaces of the CPU module 10, and a right-hand connector half CN(R) and a left-hand half CN(L) are affixed to the left-hand and right-hand side surfaces of each of the device modules 11, a connector CN may be completed by connecting these modules 12, 10 and 11 sequentially from the left to the right by connecting the pairs of left-hand and right-hand connector halves CN(L) and CN(R) such that a star-shaped serial communication network having the switch module 12 as the center node and the CPU module 10 and three device modules 11 as peripheral nodes can be automatically completed. Thus, since the CPU module 10 and the switch module 12 are connected by a single dedicated serial communication line and each of the three device modules 11 is also connected to the switch module 12 with a single dedicated serial communication line, data can be exchanged among these modules 10 and 11 at high speeds without being influenced by other modules.

The PLC 1A shown in FIG. 1 is structured with the CPU module 10 and the switch module 12 as separate modules. This is in view of the future situation where the device modules will have improved functionality with advanced functions, each including its own microprocessor, where the whole of the PLC will not be summarily controlled by the CPU module unlike the situation with the present-day PLCs, and where data will be exchanged between device modules without going through the CPU module 10.

Figure 2:
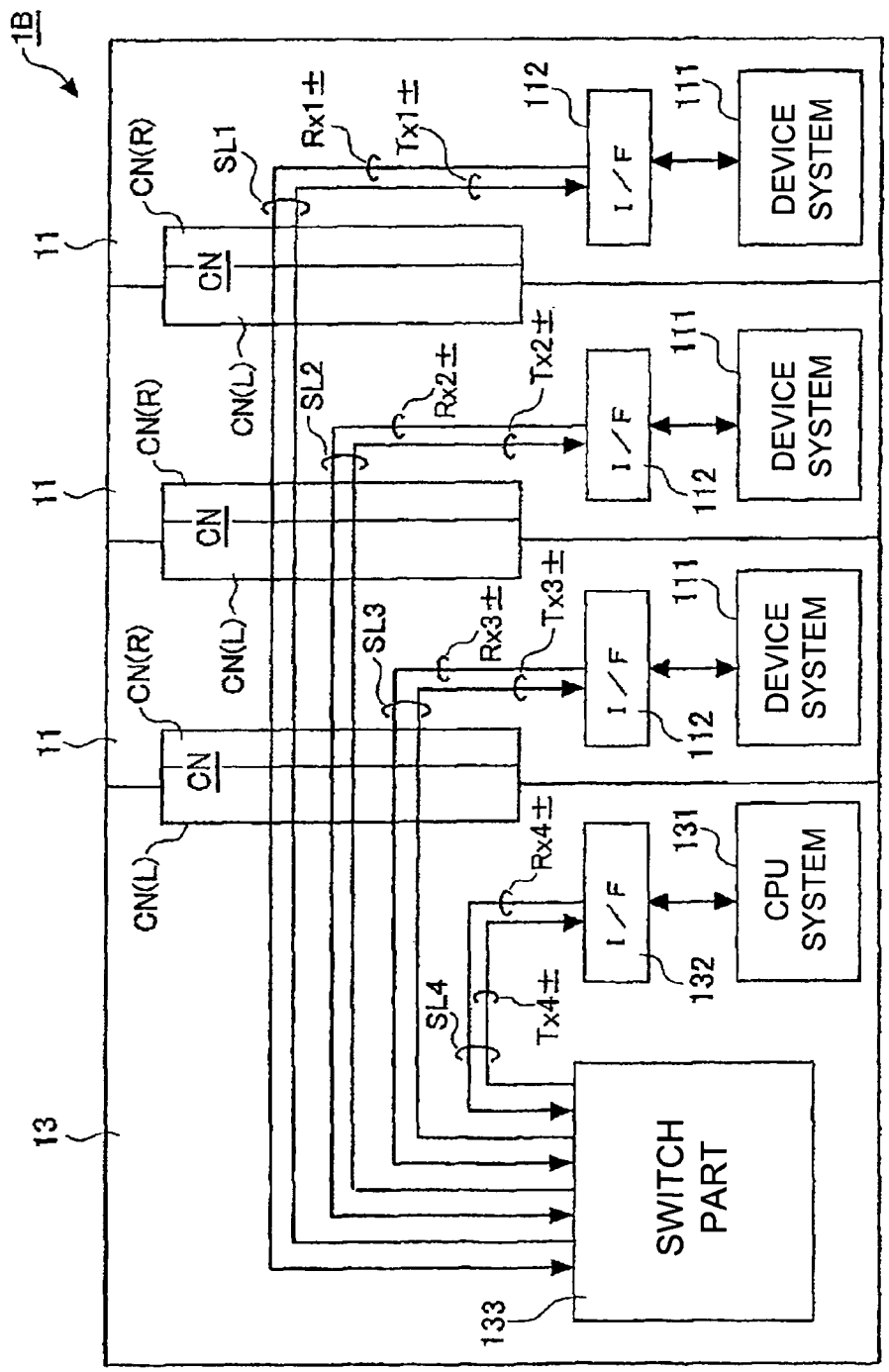
FIG. 2 is a structural diagram of another PLC embodying this invention.

FIG. 2 is a structural diagram of another PLC 1B embodying this invention, not having a CPU module and a switch module as separate modules but having a CPU system 131 and an interface 132 contained inside a switch module 13. The CPU system 131 is connected to a switch part 133 inside the switch module 13 through a communication lime SL4 such that the CPU system 131 plays the leadership role in summarily controlling each of the device modules 11.

With the PLC 1B thus structured, its external look as a whole may become approximately the same as that of a conventional PLC, one or more device modules 11 being connected to the CPU module (or switch module) 13 through the connectors CN.

Figure 6:
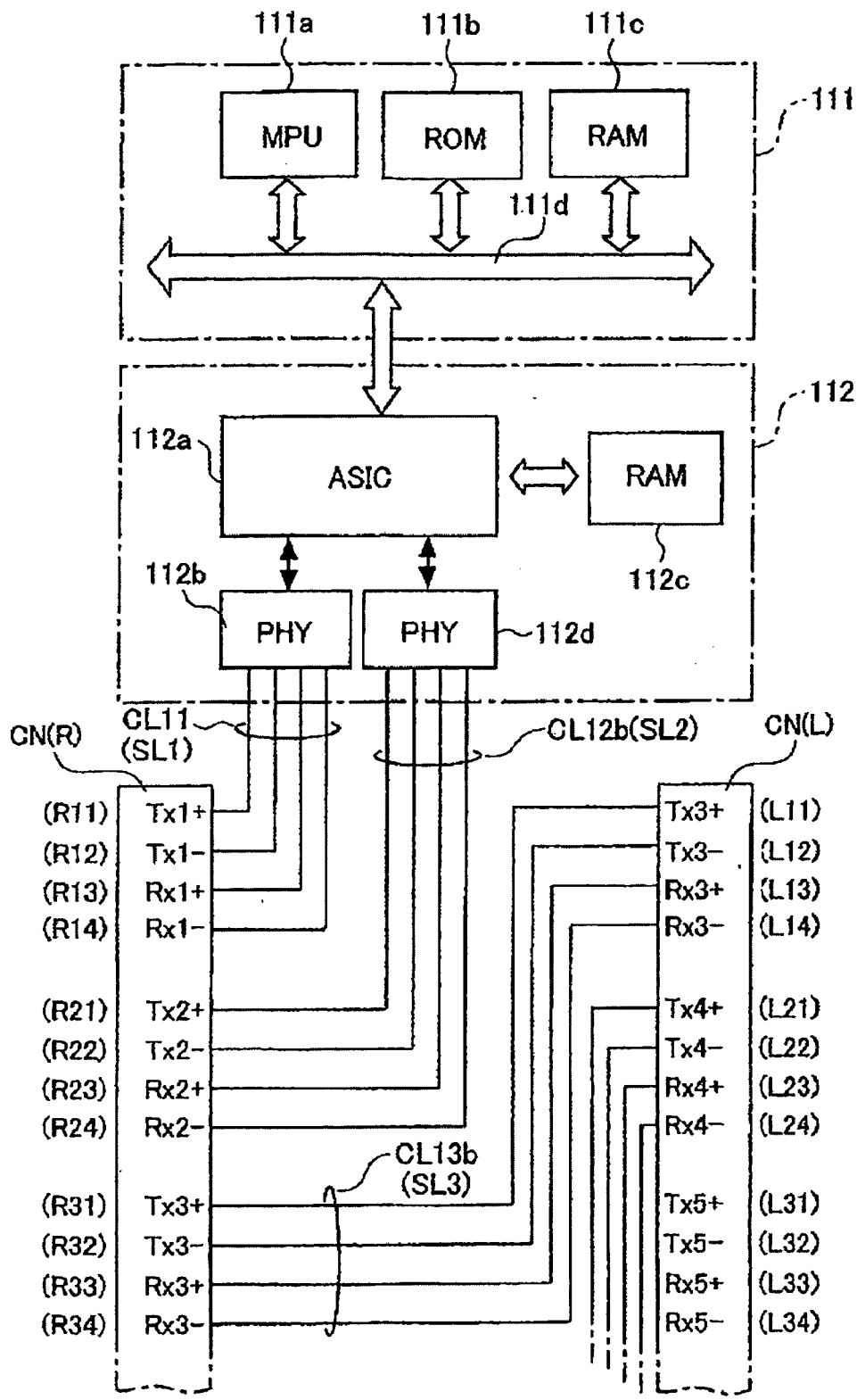
FIG. 6 is a structural diagram of still another device module of FIG. 1.
Figure 7:
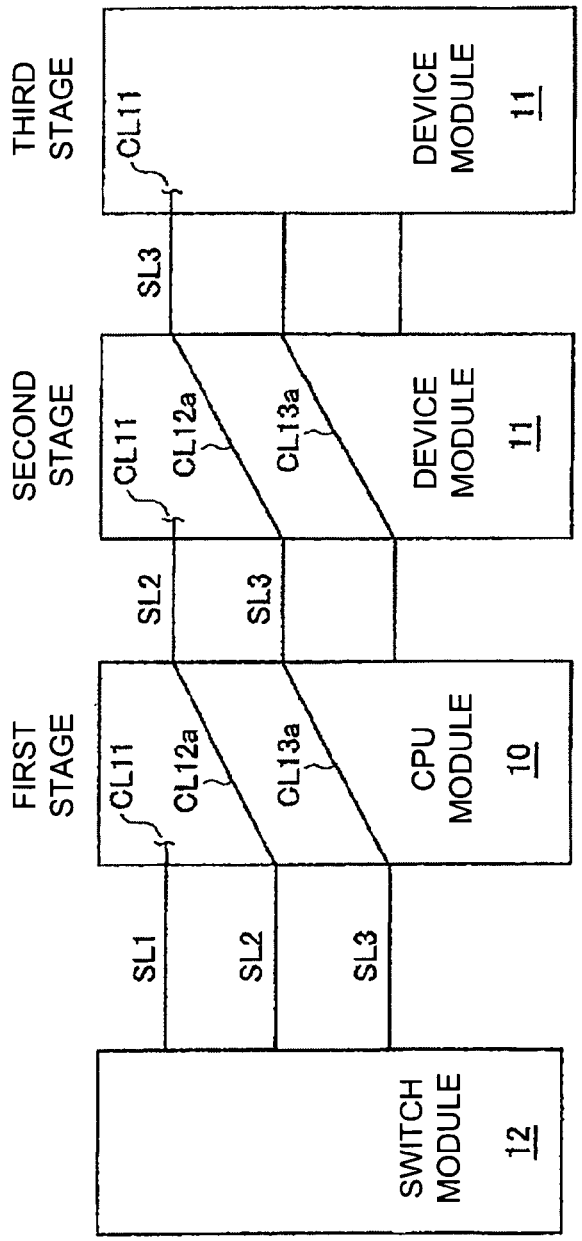
FIG. 7 is a diagram that shows the shifting of communication lines in each module.

Next, the structure of device modules for making free location possible will be explained with reference to FIGS. 5-7.

As shown, the three communication terminal groups (R11-R14, R21-R24 and R31-R34) of the near connector half CN(R) and the three communication terminal groups (L11-L14, L21-L24 and L31-L34) of the far connector half CN(L) have the same arrangement pattern in order to make a free connection possible between any mutually adjacent pair of modules.

Inner connection lines CL12a and CL12b connect those remaining two communication terminal groups of the near connector half CN(R) (R21-R24 and R31-R34) after the one assigned to the corresponding modules (R11-R14) is excluded with communication terminal groups of the far connector half CN(L) such that these remaining two communication terminals of the near connector half CN(R) (R21-R24 and R31-R34) will shift as a whole by the amount of the communication lines assigned to this device module (the amount corresponding to one line) to the uppermost position in the arrangements of the communication terminal groups in the far connector half CN(L) while the order of arrangement of the terminal groups is maintained. This shift may also be arranged to the lowermost position.

If such a structure is adopted, the uppermost communication terminal group (L11-L14) of the far connector half CN(L) of each module always has an open communication serial line not assigned to any of the modules. Thus, if the connector structure of every module is formed as described above, whether that module is at the first stage, the second stage or the third stage, as shown in FIG. 7, it can be automatically connected to a serial communication line in the open condition, that is, a module distribution by so-called free location becomes possible.

Figure 5:
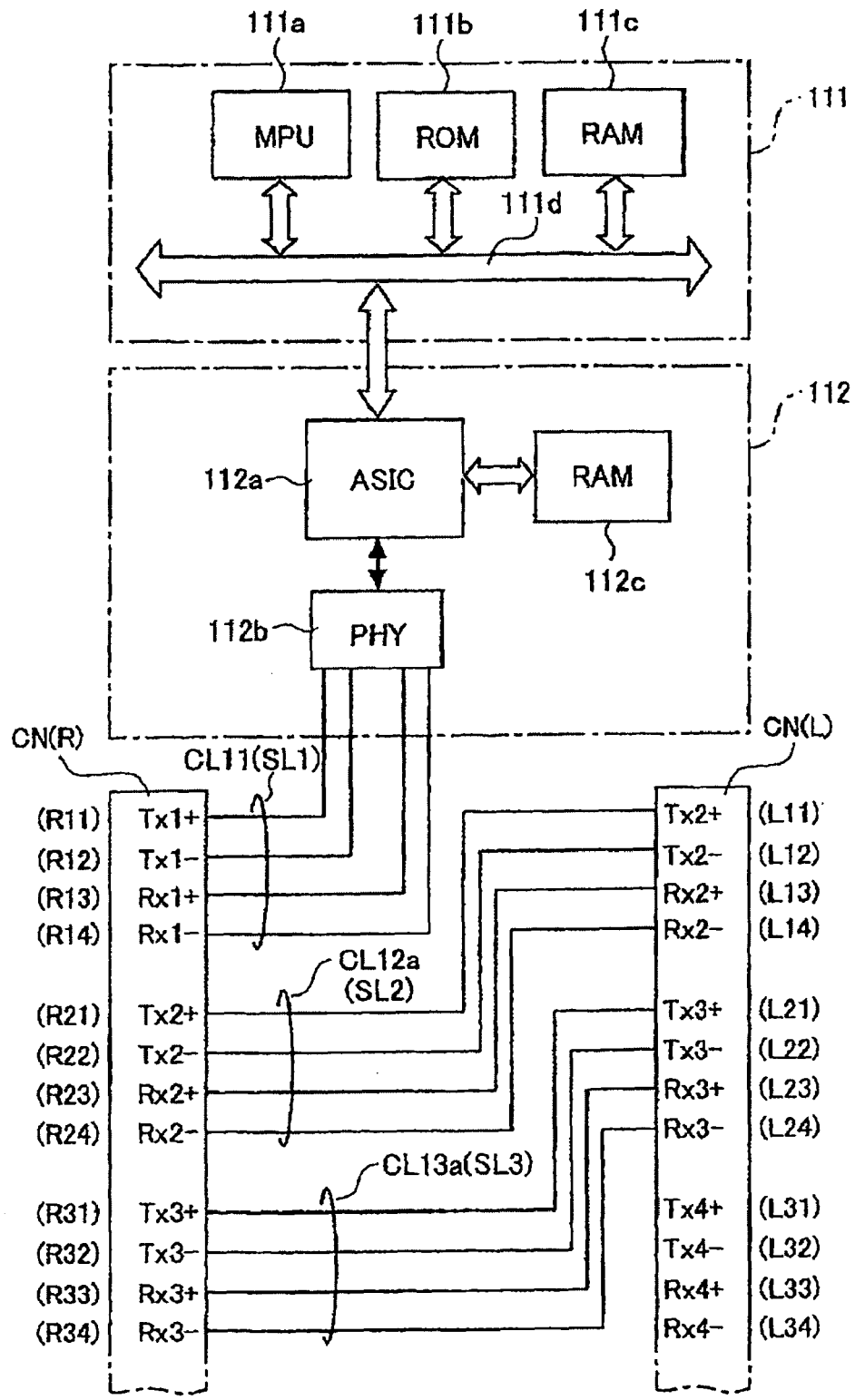
FIG. 5 is a structural diagram of another device module.

Although FIG. 5 shows an example wherein only one serial communication line SL1 is assigned to the corresponding module, two or more serial communication lines may be assigned to the corresponding module. In such a situation, as shown in FIG. 6, the number of shifts by the communication terminal groups shifted between the near and far connector halves CN(R) and CN(L) is increased. In the example shown in FIG. 6, since two serial communication lines (SL1 and SL2) are assigned to the corresponding module, the communication terminal groups are being shifted between the near and far connector halves CN(R) and CN(L) by a portion corresponding to two lines. Explained more in detail, the third communication terminal group from the top (R31-R34) in the near connector half CN(R) is connected to the uppermost communication terminal group (L11-L14) of the far connector half CN(L) through inner connection line CL13$b$.

With the module thus structured, two serial communication lines (SL1 and SL2) are occupied and an open serial communication line (SL3) appears at the communication terminal group (L11-L14) at the uppermost position of the far connector half CN(L) as in the other modules.

With PLC of the building block type according to this invention, module structures can be flexibly changed according to the user's control specification and a star-shaped serial communication network with a switch module 13 incorporating a CPU system 131 as the central node and a plurality of device nodes as peripheral nodes (as shown in FIG. 2) or with a switch module 12 not incorporating a CPU system as the central node and a CPU module and a plurality of device nodes as peripheral nodes (as shown in FIG. 1) can be constructed.

Thus, data can be exchanged among the modules without any effect of skews between bits, cross talks or ground bounce, independently of the number of connected modules and at a high constant communication speed. PLCs of the building block type according to this invention are estimated to be characteristically more advantageous than the conventional ones by the parallel or serial bus method when the transmission speed through each of the serial communication lines SL1-SL4 is 2 Gbps or faster.

Although the invention was applied to PLCs of the building block type using module-connecting mechanisms of the stacking type in the embodiments described above, the invention can be broadly applied also to the PLCs of the building block type using module-connecting mechanisms of a conventional back plane method.

Of the plurality of device modules of the PLC of building block type according to this invention, one is what is herein referred to as the multi-line supporting device module that comprises a plurality of communication ports each for connecting to different one of dedicated serial communication lines and a communication interface between the plurality of communication ports and the device system inside.

The device module described above with reference to drawings is a multi-line supporting device module as defined herein, provided with two communication ports (P1 and P2) and the communication interface 112 between these two communication ports (P1 and P2) and the device system 111 which is inside so as to support two communication lines through this communication interface 112.

Moreover, this communication interface 112 comprises a transmission processing part that generates double-system transmission frames to be transmitted from individual ones of these two communication ports (P1 and P2) based on single-system original transmission data and a reception processing part that generates single-system reception frames based on double-system reception frames obtained from individual ones of these two communication ports (P1 and P2).

Figure 13:
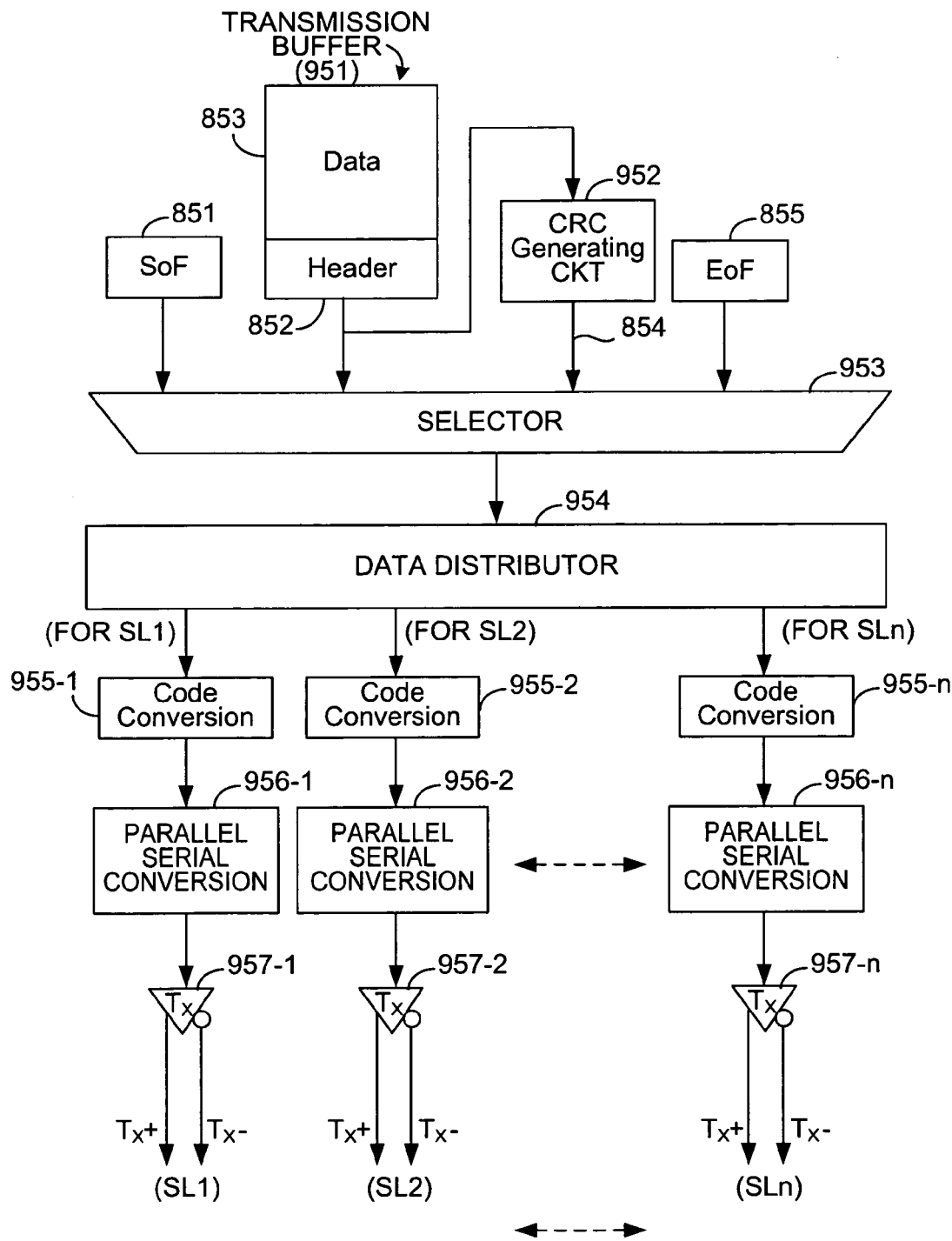
FIG. 13 is a functional diagram of the transmission processing part.

A functional diagram of the transmission processing part is shown in FIG. 13. As shown, the transmission processing part comprises a transmission buffer 951, a CRC generating circuit 952, a selector 953, a data distributor circuit 954, n code conversion circuits 955-1-955-$n$, n parallel-serial conversion circuits 956-1-956-$n$ and n differential signal pair generating circuits 957-1-957-$n$. The selector 953 is for appropriately selecting the start code 851, transmission data 853, the header 852, the CRC code 854 and the end code 855 in order to transmit them to the data distributor circuit 954. In response, the data distributor circuit 954 divides the single-system data generated based on the data 851-855 received from the selector 953 into the n-system transmission frames with the first line, the second line, . . . the nth line.

The n-system transmission frames thus obtained are transmitted individually to the corresponding one of the serial signal lines (SL1, SL2, . . . SLn) respectively through those of the code conversion circuits 955-1-955-$n$, the parallel-serial conversion circuits 956-1-956-$n$ and n differential signal pair generating circuits 957-1-957-$n$.

Figure 15:
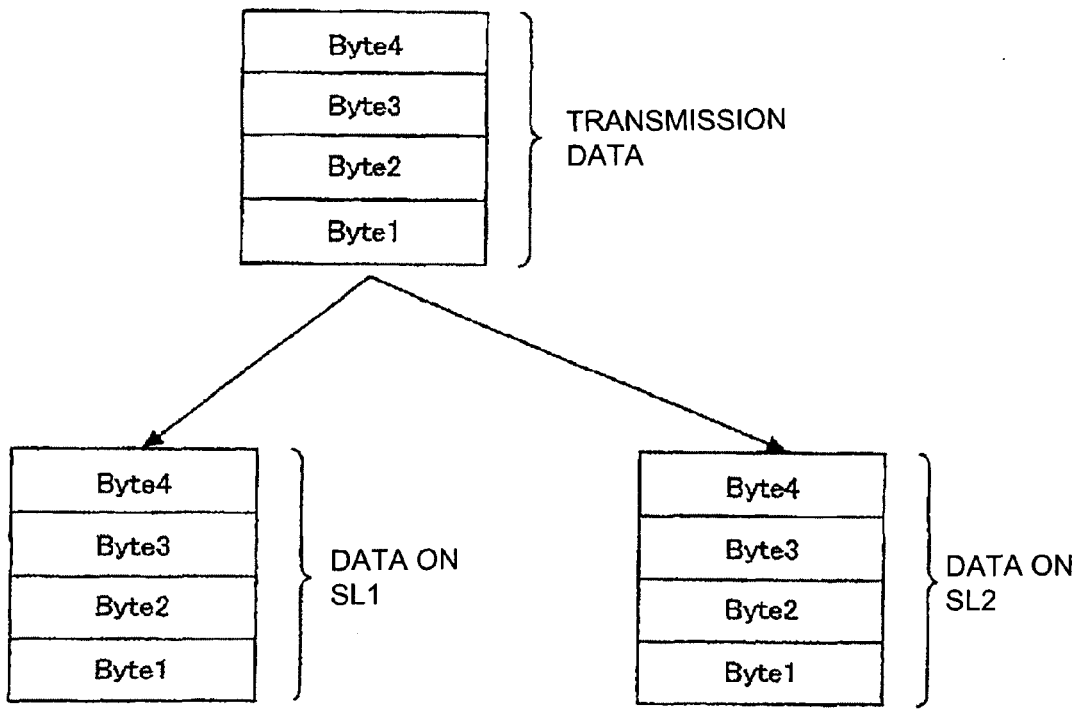
FIG. 15 is a diagram for explaining the process of transmitting transmission data to two-system serial communication lines repeatedly.

There are possibly two operation modes to be supported for the data distributor circuit 954. According to one of these operation modes, each of the plurality of transmission frames generated by the transmission processing part contains, as real transmission data, data that are identical to the original transmission data such that these identical data are transmitted repeatedly to the multi-line serial communication lines between this device module and the switch module. Explained more in detail, the operation according to this mode corresponds, for example, to the situation where, as shown in FIG. 15, transmission data are transmitted repeatedly to double-system serial communication lines (SL1 and SL2).

Figure 16:
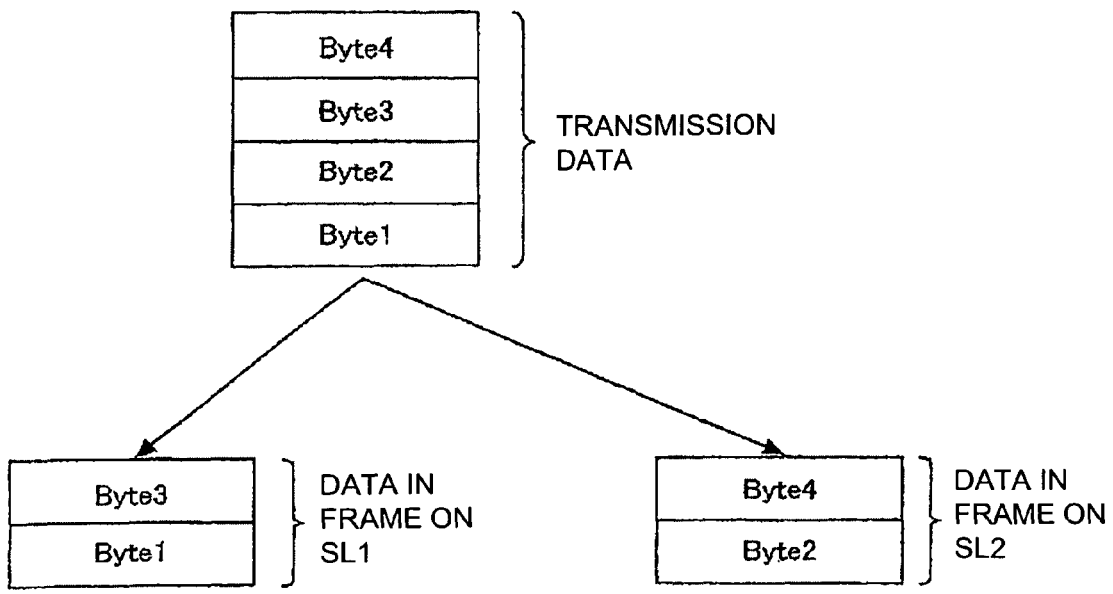
FIG. 16 is a diagram for explaining the process of transmitting transmission data to two-system serial communication lines by halves.

In the other operation mode, each of the multi-system transmission frames generated by the transmission processing part contains, as real transmission data, individual divided data obtained by dividing the original transmission data into a plurality of parts such that these individual divided data are separately transmitted to different ones of the multi-line serial communication lines between this device module and the switch module. Explained more in detail, the operation according to this mode corresponds, for example, to the situation where, as shown in FIG. 16, transmission data are transmitted in halves through the double-system serial communication lines (SL1 and SL2).

Figure 14:
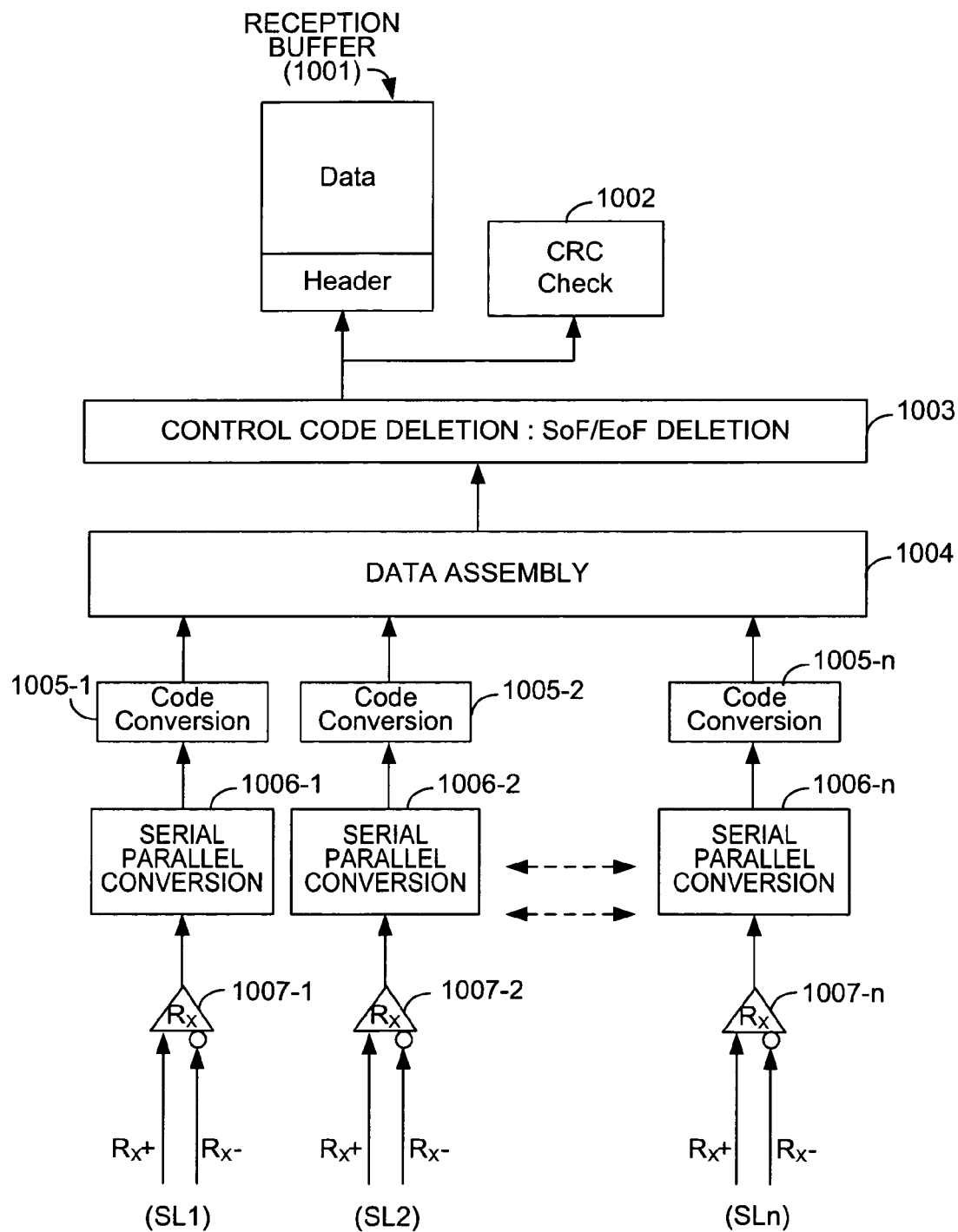
FIG. 14 is a functional diagram of the reception processing part.

A functional diagram of the reception processing part is shown in FIG. 14. As shown, the reception processing part comprises a reception buffer 1001, a CRC check circuit 1002, a control code deletion circuit 1003, a data assembly circuit 104, n code conversion circuits 1005-1-1005-$n$, n serial-parallel conversion circuits 1006-1-1006-$n$ and n differential signal pair reproduction circuits 1007-1-1007-$n$. The n differential signal pairs received from the n serial communication lines SL1, SL2, . . . SLn are converted through the reproduction circuits 1007-1-1007-$n$ to single-system signals, and after they are passed through the serial-parallel conversion circuits 1006-1-1006-$n$ and the code conversion circuits 1005-1-1005-$n$, the data are reproduced in the individual systems. The data thus reproduced in the individual systems are assembled into single-system data by the data assembly circuit 1004 and are passed through the control code deletion circuit 1003 to have the start code and the end code, reproduced by being combined into single-system data and stored in the reception buffer 1001.

There are possibly two operation modes to be supported by the data assembly circuit 1004. According to one of these operation modes, single-system reception data generated by the reception processing part are formed as one reception data item selected by a specified rule from the reception data contained in each of the multi-system reception frames. This corresponds to the process in the situation shown in FIG. 15 where transmission data are transmitted repeatedly through double-system serial communication lines (SL1 and SL2). In other words, it is so structured that, of the identical data that are transmitted on the double-system serial communication lines (SL1 and SL2), the data on a preliminarily determined side will always be received while it will be switched to the data on the other side in the case of any problem with the selected serial communication line such that reliability of the data communication can be maintained.

According to the other of the operation modes, single-system reception data generated by the reception processing part are formed as combined data obtained by combining reception data contained in the multiple-system reception frames. This corresponds to the situation shown in FIG. 16 wherein transmission data are transmitted in halves through the double-system serial communication lines (SL1 and SL2). In such a case, the halves are combined by the reception side to reproduce the original data. Thus, while data can be transmitted at a fast rate, the receiving side can reliably reproduce the original data.

Although embodiments were shown above wherein modules are connected to the right-hand side of a switch module sequentially, the other modules may be connected to both sides of the switch module in the middle. If this is done, the serial communication lines from the switch module to the other modules become shorter and hence the design of the signal lines is expected to become easier in the case of PLCs with transmission speed of 2 Gbps or faster.

Since it is basically a serial communication according to this invention, there is no need to consider the effects of skews between bits, cross talks or ground bounce, unlike the situation using a parallel bus with multidrop connection. Since dedicated serial communication lines are used instead of bus lines, furthermore, the transmission capability is not adversely affected by an increase in the number of connected modules as long the switching operations by the switch part are appropriately designed. In particular, if a plurality of lines connected in parallel are used for the serial communication lines between each device module or the CPU module and the switch module, an optimal data communication capability can be maintained according to the transmission capacity of each module.

Thus, according to this invention, an optimum transmission mode can be selected according to the current condition during the operation of the PLC because it is possible to appropriately correlate single-system original communication data and multi-line serial communication lines, instead of transmitting single-system original transmission data directly to a single-system serial communication line. At the time of reception, too, an optimum reception mode can be selected according to the current condition since multi-system reception frames can be received in correlation with single-system reception data, instead of receiving them by individually switching them.

If the serial communication lines between each device module or the CPU module and the switch module are parallel lines, and the communication interface inside a multi-line supporting type of device module is structured so as to include a transmission processing part for generating multi-system transmission frames to be transmitted individually from a plurality of communication ports based on single-system original transmission data and a reception processing part for generating single-system reception data based on multi-system reception frames obtained individually from the plurality of communication ports, it becomes possible to correlate one transmission or reception data item with serial communication serial lines with a plurality of lines such that reliable and speedy data communications are enabled.

What is claimed is:
1. A PLC of building block type comprising:
a switch module incorporating a switch part having N-to-N switch function between serial communication lines with a plurality of lines; and
a plurality of device modules individually incorporating device systems with various function device module characteristics;
wherein a CPU system having CPU functions of said PLC is incorporated either in said switch module or in a CPU module that is provided independently of said switch module;
wherein said plurality of device modules and the switch module incorporating said CPU system, or said CPU module, said plurality of device modules and the switch module not incorporating said CPU system, are connected together into a single body in a building block structure through module-connecting mechanisms; and
wherein dedicated serial communication lines each with a single line or a plurality of lines connect between said switch module incorporating said CPU system and each of said plurality of device modules such that a star-shaped serial communication network is formed with said switch module incorporating said CPU system as a central node and each of said plurality of device modules as a peripheral node, or between said switch module not incorporating said CPU system and said CPU system and each of said plurality of device modules such that a star-shaped serial communication network is formed with said switch module not incorporating said CPU system as a central node and said CPU system and each of said plurality of device modules as a peripheral node;
wherein each of said module-connecting mechanism comprises a first connecting mechanism on the side of said switch module and a second connecting mechanism on said CPU module or one of said plurality of device modules;
wherein said first connecting mechanism comprises:
a connector half on the side of said switch module that is provided on one of side surfaces of module housing of said switch module and has a communication terminal groups for a plurality of lines; and
switch connection lines that connect each of said communication terminal groups of said connector half on the side of said switch module and a corresponding one of communication ports of said switch part inside said switch module,
wherein said second connecting mechanism comprises:
a near connector half on said CPU module or one of said plurality of device modules that is provided on a side surface of module housing of the corresponding module on the side nearer said switch module when the modules are connected together and has one or more communication terminal groups corresponding to the number of lines of serial communication lines introduced from another module adjacent on the nearer side;

a far connector half on said CPU module or one of said plurality of device modules that is provided on another side surface of said module housing of the corresponding module on the side farther from said switch module when the modules are connected together and has one or more communication terminal groups corresponding to the number of lines of serial communication lines introduced from another module adjacent on the farther side;

inner system connection lines connecting one or more of said communication terminal groups of said near connector half that are assigned to the corresponding module and a communication interface incorporated in the corresponding module; and inner connector connection lines connecting remaining ones of said communication terminal groups of said near connector half excluding said one or more assigned communication terminal groups and the communication terminal groups of said far connector half.

2. The PLC of claim 1 wherein the arrangement pattern of the plurality of communication terminal groups of said near connector half and the arrangement pattern of the plurality of communication terminal groups of said far connector half are the same in said second connecting mechanism such that any mutually adjacent modules can be freely connected; and wherein said inner connector connection lines connect said near connector half and said far connector half such that said remaining ones of said communication terminal groups will be shifted as a whole by the number of communication lines assigned to the corresponding device module to the uppermost or lowermost position in the arrange of communication terminal groups in said far connector half while maintaining the arrangement sequence of the terminal groups.

3. The PLC of claim 1 wherein said switch part comprises a memory that stores setting data for defining an operation form for carrying out said N-to-N switch function and said switch part carries out switching operations according to said operation form defined by said setting data stored by said memory.

4. The PLC of claim 3 wherein said operation form defined by said setting data is such that a communication frame inputted to one of communication ports of said switch part is unconditionally caused to be outputted from preliminarily determined one or more of said communication ports.

5. The PLC of claim 3 wherein said operation form defined by said setting data is such that a communication frame inputted to one of communication ports of said switch part is caused to be outputted from one or more of said communication ports that are determined by addressee data contained in said inputted frame.

6. The PLC of claim 3 wherein said operation form defined by said setting data is such that if serial data with a plurality of frames in series are inputted to one of communication ports of said switch part and the first frame contains addressee data and a switch hold command, the switch condition is maintained in a hold condition until said frames in series are completely outputted from one or more of said communication ports that are determined by said addressee data.

7. The PLC of claim 1 wherein the transmission speed of each of said serial communication lines is 2 Gbps or faster.

8. A PLC of building block type comprising:

a switch module incorporating a switch part having N-to-N switch function between serial communication lines with a plurality of lines; and a plurality of device modules individually incorporating device systems with various function device module characteristics;

wherein a CPU system having CPU functions of said PLC is incorporated either in said switch module or in a CPU module that is provided independently of said switch module;

wherein the switch module incorporating said CPU system and said plurality of device modules, or the switch module not incorporating said CPU system, said CPU module and said plurality of device modules, are connected together into a single body in a building block structure through module-connecting mechanisms;

wherein dedicated serial communication lines each with a single line or a plurality of lines connect between said switch module incorporating said CPU system and each of said plurality of device modules or between said switch module not incorporating said CPU system and said CPU system and each of said plurality of device modules; and wherein said plurality of device modules include a multi-line supporting device module that has:

a plurality of communication ports each for connecting to different one of dedicated serial communication lines; and a communication interface between said plurality of communication ports and the device system inside, said communication interface including:

a transmission processing part that generates multi-system transmission frames to be transmitted from individual ones of said plurality of communication ports based on single-system original transmission data; and a reception processing part that generates single-system reception frames based on multi-system reception frames obtained from individual ones of said plurality of communication ports.

9. The PLC of claim 8 wherein each of said multi-system transmission frames contains data identical to said original transmission data as real transmission data and wherein data identical to said original transmission data are repeatedly transmitted to individual ones of said serial communication lines connected between the device module and said switch module.

10. The PLC of claim 8 wherein each of said multi-system transmission frames contains, as real transmission data, individual divided data obtained by dividing said original transmission data and wherein said individual divided data are transmitted separately to individual ones of said serial communication lines connected between the device module and said switch module.

11. The PLC of claim 8 wherein said single-system reception frames are formed as a single data item selected according to a specified rule from reception data contained in said multiple-system reception frames.

12. The PLC of claim 8 wherein said single-system reception frames are formed as combined data obtained by combining reception data contained in said multiple-system reception frames.

13. The PLC of claim 8 wherein the transmission speed of each of said serial communication lines is 2 Gbps or faster.

* * * * *